(12) United States Patent
Matsubara

(10) Patent No.: US 8,278,760 B2
(45) Date of Patent: Oct. 2, 2012

(54) SEMICONDUCTOR INTEGRATED CIRCUIT AND METHOD FOR MANUFACTURING SAME, AND MASK

(75) Inventor: Yoshihisa Matsubara, Ibaraki (JP)

(73) Assignee: Renesas Electronics Corporation, Kanagawa (JP)

( * ) Notice: Subject to any disclaimer, the term of this patent is extended or adjusted under 35 U.S.C. 154(b) by 1024 days.

(21) Appl. No.: 11/783,962

(22) Filed: Apr. 13, 2007

(65) Prior Publication Data

US 2007/0241329 A1 Oct. 18, 2007

(30) Foreign Application Priority Data

Apr. 17, 2006 (JP) ................................. 2006-113609

(51) Int. Cl.
*H01L 23/48* (2006.01)
*H01L 29/40* (2006.01)
(52) U.S. Cl. ................. 257/773; 257/E23.169
(58) Field of Classification Search .................. 257/773, 257/775, 784, E23.141, E23.169
See application file for complete search history.

(56) References Cited

U.S. PATENT DOCUMENTS

| | | | |
|---|---|---|---|
| 5,838,050 A * | 11/1998 | Ker et al. ...................... | 257/401 |
| 6,551,895 B1 * | 4/2003 | Hsu et al. ...................... | 438/396 |
| 6,593,226 B2 * | 7/2003 | Travis et al. .................. | 438/626 |
| 6,693,357 B1 * | 2/2004 | Borst et al. ................... | 257/773 |
| 6,764,808 B2 * | 7/2004 | Okoroanyanwu et al. .... | 430/311 |
| 6,894,341 B2 * | 5/2005 | Sugimae et al. .............. | 257/315 |
| 6,995,412 B2 * | 2/2006 | Fried et al. ..................... | 257/296 |
| 7,208,404 B2 * | 4/2007 | Tsao et al. ..................... | 438/618 |
| 7,229,723 B2 * | 6/2007 | Rau .................................... | 430/5 |
| 7,304,497 B2 * | 12/2007 | Phoon et al. ..................... | 326/38 |
| 7,479,700 B2 * | 1/2009 | Takewaki et al. ............. | 257/758 |
| 7,541,652 B1 * | 6/2009 | Abughazaleh ................ | 257/372 |
| 2002/0187440 A1 * | 12/2002 | Kochi et al. .................... | 430/394 |
| 2003/0162135 A1 * | 8/2003 | Okoroanyanwu et al. .... | 430/394 |
| 2004/0195582 A1 * | 10/2004 | Tomita et al. .................. | 257/127 |
| 2008/0128893 A1 * | 6/2008 | Uno ............................. | 257/700 |

FOREIGN PATENT DOCUMENTS

| | | |
|---|---|---|
| JP | 4-287908 | 10/1992 |
| JP | 6-89839 | 3/1994 |
| JP | 6-181164 | 6/1994 |
| JP | 2006-44072 | 2/2006 |

OTHER PUBLICATIONS

J. Torkel Wollmark, "Is There a Minimum Linewidth in Integrated Circuits?", Jan. 20, 2006, Springer Berlin/ Heidelberg, Lecture Notes in Physics, vol. 122, pp. 163-276.*

Jason Cong et al., "Wire Width Planning for Interconnect Performance Optimization", IEEE Transactions on Computer-Aided Design of Integrated Circuits and Systems, vol. 21, No. 3, Mar. 2002, pp. 319-329.*

* cited by examiner

*Primary Examiner* — William D Coleman

(74) *Attorney, Agent, or Firm* — Young & Thompson

(57) ABSTRACT

A semiconductor integrated circuit includes a first conductor provided in a first region on a substrate and a second conductor provided in a second region on the substrate. The second region is a region enclosing the first region. A minimum design dimension in linewidth of the first conductor is smaller than a minimum design dimension in linewidth of the second conductor.

4 Claims, 14 Drawing Sheets

SEMICONDUCTOR INTEGRATED CIRCUIT AND METHOD FOR MANUFACTURING SAME, AND MASK

This application is based on Japanese patent application No. 2006-113609, the content of which is incorporated hereinto by reference.

BACKGROUND

1. Technical Field

The present invention relates to a semiconductor integrated circuit and a method for manufacturing thereof, and also relates to a mask employed for a manufacture thereof.

2. Related Art

A typical test pattern utilized for an evaluating a process for a semiconductor integrated circuit will be described. A general view of a layout of a test chip for a general process evaluation is shown in FIG. 7. Maximum values of a width d1 and a vertical width d2 of a test chip are generally defined by employing a maximum field size d3 of a lithographic apparatus. In this case, a maximum field size is presented to be 25 mm. An evaluation pattern is composed of an assembly of evaluation blocks, which are also called sub chip 404. The dimensions of the sub chips are constant in the interior of the testing block. The reason thereof is that this leads to a fixed arrangement and a constant moving distance of measuring probes in a program for measurement, thereby achieving a common use of a program and a sharing of measurement probes.

The pattern for evaluating the interconnect process includes via chains, a pattern for evaluating electro migration (EM), a pattern for measuring a leakage or the like, which are mounted therein. Concerning the via chain, a pattern scaling is generally changed according to the length of the interconnect to be evaluated and the number of vias. A defect density can also be evaluated by utilizing different pattern scaling.

Subsequently, a general process for forming a multiple-layered interconnect will be described, in reference to a process for forming a dual-layered interconnect. Here, FIGS. 8A and 8B, FIGS. 9A and 9B, and FIGS. 10A to 10C are cross-sectional views illustrating the process. FIGS. 11A and 11B, FIGS. 12A and 12B, and FIGS. 13A to 13C are plan views illustrating the process. First of all, an interlayer insulating film 502 composed of a silicon oxide film or the like is formed on a substrate 501 by a chemical vapor deposition (CVD) process or the like (FIG. 8A and FIG. 11A). Elements such as a transistor (not shown) and the like are formed in the substrate 501. In addition to above, a fine region R1 and a rough region R2 in FIG. 8A correspond to the left side and the right side of FIG. 11A, respectively. Such correspondences are also found in FIGS. 8A and 8B, FIGS. 9A and 9B, FIGS. 10A to 10C, FIGS. 11A and 11B, FIGS. 12A and 12B and FIGS. 13A to 13C.

Next, a resist 503 for fluorine ($F_2$) lithography is formed on the interlayer insulating film 502. Then, the resist 503 is patterned with a mask having a pattern of not larger than 0.1 μm by a photolithographic process utilizing $F_2$ wave length (FIG. 8B and FIG. 11B). Further, the pattern of the resist is transferred to the interlayer insulating film 502 by dry etching technology to form trenches 504 for interconnects having linewidth of not larger than 0.1 μm in desired locations. Thereafter, remaining portions of the resist 503 are removed (FIG. 9A and FIG. 12A).

Subsequently, a resist 505 for argon fluoride (ArF) lithography is formed on the interlayer insulating film 502. Then, the resist 505 is patterned with a mask having a pattern of larger than 0.1 μm by a photolithographic process utilizing ArF wave length (FIG. 9B and FIG. 12B). Further, the pattern of the resist is transferred to the interlayer insulating film 502 by dry etching technology to form trenches 506 for interconnects having linewidth of larger than 0.1 μm in desired locations. Thereafter, remaining portions of the resist 505 are removed (FIG. 10A and FIG. 13A).

Then, a conductor film 507 such as copper (Cu) film, aluminum (Al) film and the like is deposited on the entire surface of the interlayer insulating film 502 having the trenches 504 and 506 for interconnects by a CVD process or the like (FIG. 10B, FIG. 13B). Thereafter, the conductor film 507 is polished by a chemical mechanical polishing (CMP) process or the like until the interlayer insulating film 502 is exposed. This results in s formation of an interconnect 508 having a damascene structure in a desired position of the interlayer insulating film 502 (FIG. 10C and FIG. 13C).

FIG. 14 is a plan view, showing an outline of a general logic product. A conventional configuration in general central processing unit (CPU) logic circuits will be described in reference to the diagram. This product has four macro-functions, namely an input-output (I/O) block 701, a random access memory (RAM) block 702, a logic block 703 and a phase locked loop (PLL) block 704.

The I/O block 701 is an area that is composed of only interconnects having the linewidth of not smaller than 1 μm. In such area, there is basically no need for a narrower interconnect. Further, this area serves as determining a limitation on an allowable high-current, and maximum values of the linewidth and the via dimension are determined by such area. An interconnect that connects the circuit blocks in an I/O block is composed of two interconnects, namely an interconnect that is connected to a pad electrode (input interconnect) and an interconnect that is connected to an internal circuit (output interconnect). In conventional structures, such region is provided with a transistor for checking operation mounted therein, and is designed to be provided with a device that has a minimum dimension, which is same as that of the RAM block 702.

The RAM block 702 generally includes a memory device of around 1 MB. A priority is given to a miniaturization for the interconnects in such area over an operating speed. Therefore, this area is an area of highest need for narrower interconnects. Relatively few large interconnects are included in this area, and power supply interconnects and ground interconnects are alternately disposed with a pitch of a memory cell size.

The logic block 703 is a cell, in which higher drive capacity is required, and is also a block, in which power supply interconnects are enhanced. A configuration of this area is basically similar to a configuration of a standard cell of a gate array. The configuration of this area related to the interconnects generally includes enhanced power supply interconnects as compared with that of the RAM, though it is similar to that of RAM. A plurality of connections between macro circuits are generally included, unlikely with the case of the PLL.

Since stable operations of the power supply, the ground and the capacitor element are prioritized in the PLL block 704, the PLL block 704 generally requires second largest linewidth, second only to the I/O region, though the interconnect density therein is lower. The PLL serves as amplifying a signal input from an external transmitter (amplifying a signal to, for example, in 4 times or 5 times of the original), so as to compose clock trees in respective macros. Only two input and output interconnects basically exist in the PLL.

In addition to above, typical prior art documents related to the present invention includes Japanese Laid-Open patent publication No. H6-89839.

SUMMARY OF THE INVENTION

A miniaturization of a semiconductor integrated circuit is rapidly progressed for achieving more sophisticated semiconductor integrated circuit with lower cost. In order to manufacture finer integrated circuits, progressively decreased wave length is employed for lithography apparatus. Nonetheless, the progressively decreased wave length in the lithography operation in the process for manufacturing the semiconductor integrated circuit causes a problem of insufficient optical intensity of the short wave length lithography apparatus. Further, the shorter wave length of the optical lithography apparatus causes more severe damage to optical lens. On the other hand, dimension of a die itself for a semiconductor integrated circuit is rather increased and not decreased due to an increased scale of the circuits, even if the level of the integration of the circuit element is progressed. Therefore, in the short wave length lithography apparatus, in which a requirement of establishing larger field size causes insufficient optical intensity, as compared with the long wave length lithography apparatus, it is difficult to ensure the compatibility with providing larger field size and higher resolution. Further, a flare is generated near a location where a larger transparent portion of the pattern is located, leading to a problem of deteriorated resolution of the fine pattern. Difference in light exposure levels is also caused in forming micro interconnects. In addition, an increased proximity correction causes that a larger difference in areas leads to larger correction, causing a problem of requiring an increased operations for optimizing the correction.

According to the present invention, there is provided a semiconductor integrated circuit, including: a first interconnect provided in a first region on a substrate; and a second interconnect provided in a second region that surrounds the first region on the substrate, wherein a minimum design dimension in linewidth of the first interconnect is smaller than a minimum design dimension in linewidth of the second interconnect.

In this semiconductor integrated circuit, the minimum design dimension in linewidth of the first interconnect is relatively smaller, and the minimum design dimension in linewidth of the second interconnect is relatively larger. Therefore, in the manufacture of such semiconductor integrated circuit, lithography with light of the first wave length (hereinafter referred to as short wave length lithography) can be employed for forming the interconnect pattern of the first interconnect, and lithography with light of the second wave length that is longer than the first wave length (hereinafter referred to as long wave length lithography) can be employed for forming the interconnect pattern of the second interconnect. Here, the second region provided with the second interconnect is the region surrounding (or enclosing) the first region provided with the first interconnect. Therefore, a field size in the short wave length lithography is smaller than a field size in the long wave length lithography. This configuration allows obtaining sufficient optical intensity in the short wave length lithography. This contributes to an improvement in the resolution of the short wave length lithography, and eventually a miniaturization of the first interconnect.

According to the present invention, there is also provided a mask employed for manufacturing the semiconductor integrated circuit, including: a first mask pattern, formed in a first portion of the mask, corresponding to an interconnect pattern of the first interconnect and being to be transferred to the first region on the substrate by lithography utilizing light of a first wave length; and a second mask pattern, formed in a second portion that surrounds the first portion of the mask, corresponding to an interconnect pattern of the second interconnect, and being to be transferred to the second region on the substrate by lithography utilizing light of a second wave length, which is longer than the first wave length.

According to the configuration of the mask, the first mask pattern formed in the first portion is transferred to the first region on the substrate by the short wave length lithography, and the second mask pattern formed in the second portion is transferred to the second region on the substrate by the long wave length lithography. Here, the second portion is the portion surrounding (or enclosing) the first portion. Therefore, a field size in the short wave length lithography is smaller than a field size in the long wave length lithography. This configuration allows obtaining sufficient optical intensity in the short wave length lithography.

According to the present invention, there is also provided a method for manufacturing a semiconductor integrated circuit employing the mask, including: transferring the first mask pattern onto the first region on the substrate by lithography utilizing the light of the first wave length; and transferring the second mask pattern onto the second region on the substrate by lithography utilizing the light of the second wave length.

In such method for manufacturing the semiconductor integrated circuit, the short wave length lithography and the long wave length lithography are employed for transferring the first and the second mask patterns, respectively. Here, the second portion is the portion surrounding (or enclosing) the first portion. Therefore, a field size in the short wave length lithography is smaller than a field size in the long wave length lithography. This configuration allows obtaining sufficient optical intensity in the short wave length lithography.

According to the present invention, a semiconductor integrated circuit that allows obtaining sufficient optical intensity in the short wave length lithography and a method for manufacturing thereof, and a mask, can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary implementations of semiconductor integrated circuits and methods for manufacturing thereof, and masks according to the present invention will be described in reference to the annexed figures. In all figures, identical numeral is assigned to an element commonly appeared in both of the description of the present invention the description of the related art, and the detailed description thereof will not be repeated.

Figure 1:
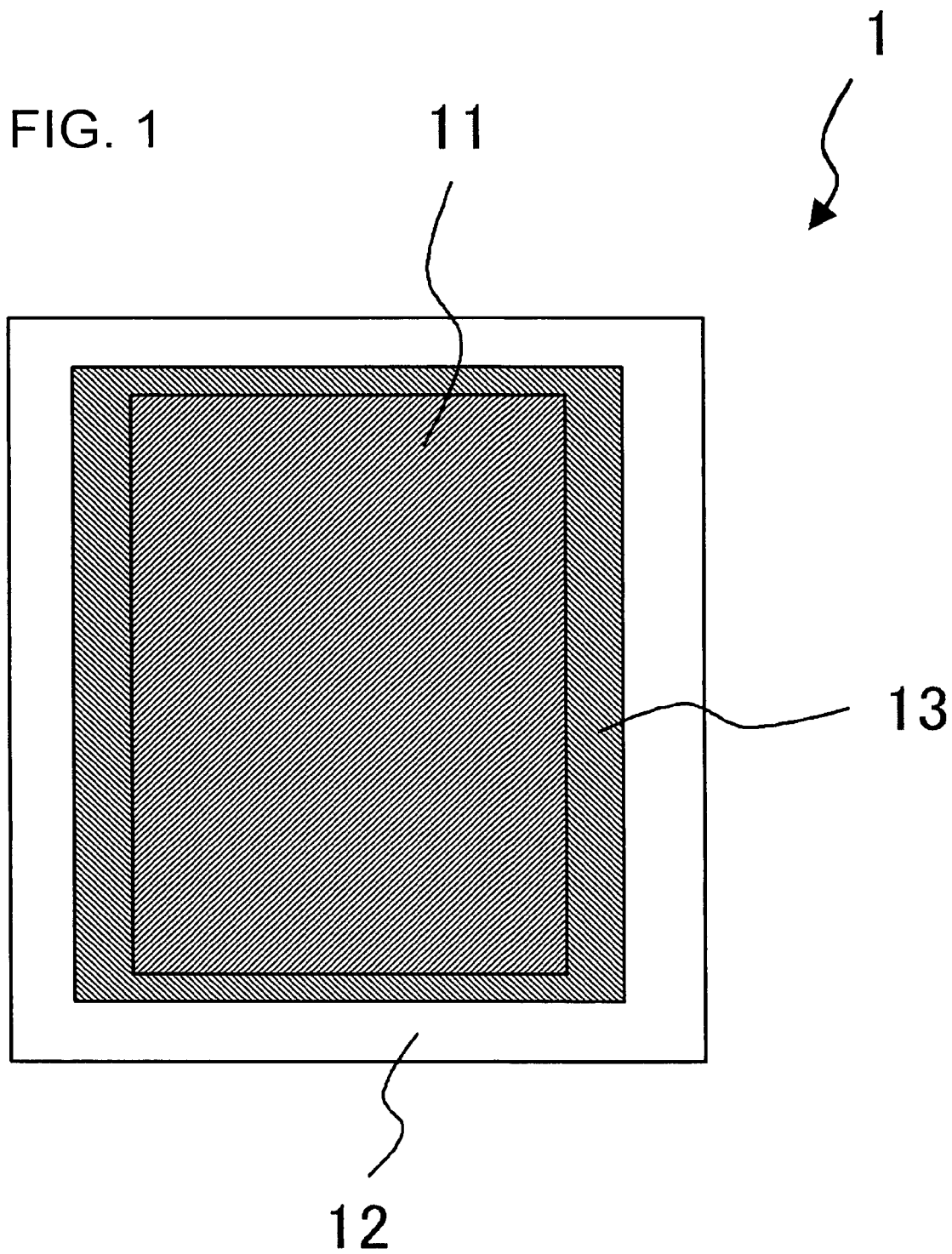
FIG. 1 is a plan view, illustrating a semiconductor integrated circuit according to an embodiment of the present invention.

FIG. 1 is a plan view, showing a semiconductor integrated circuit according to an embodiment of the present invention. A semiconductor integrated circuit 1 includes a substrate, a first interconnect provided in a region 11 (first region) on the substrate and a second interconnect provided in a region 12 (second region) on the substrate. Here, the substrate and the first and the second interconnects are not shown in FIG. 1. The substrate may be a semiconductor substrate, or may be a substrate other than a semiconductor substrate.

The region 12 is a region enclosing the region 11. Therefore, a field size of the region 11 is smaller than that of the region 12. Further, the region 11 is transversely and longitudinally symmetric around a center of the semiconductor integrated circuit. The region 11 and the region 12 are the region for short wave length lithography and the region for long wave length lithography, respectively.

In the short wave length lithography and the long wave length lithography, an excimer laser beam, for example, may be employed. More specifically, for example, a $F_2$ excimer laser beam may be employed for the short wave length lithography, and an ArF excimer laser beam may be employed for the long wave length lithography. In the case of the present embodiment, the first and the second wave lengths are 157 nm and 193 nm, respectively.

A minimum design dimension in linewidth of the first interconnect is smaller than a minimum design dimension in linewidth of the second interconnect. The minimum design dimension in linewidth of the first interconnect is, for example, equal to or smaller than 0.1 μm. Further, the region 11 is spaced apart from the region 12. No interconnect pattern is present in a region 13 (pattern-prohibited region) between the region 11 and the region 12. Width of the region 13 is, for example, about 10 μm. The region 12 is, for example, a region for input and output circuits of the semiconductor integrated circuit 1.

Figure 2:
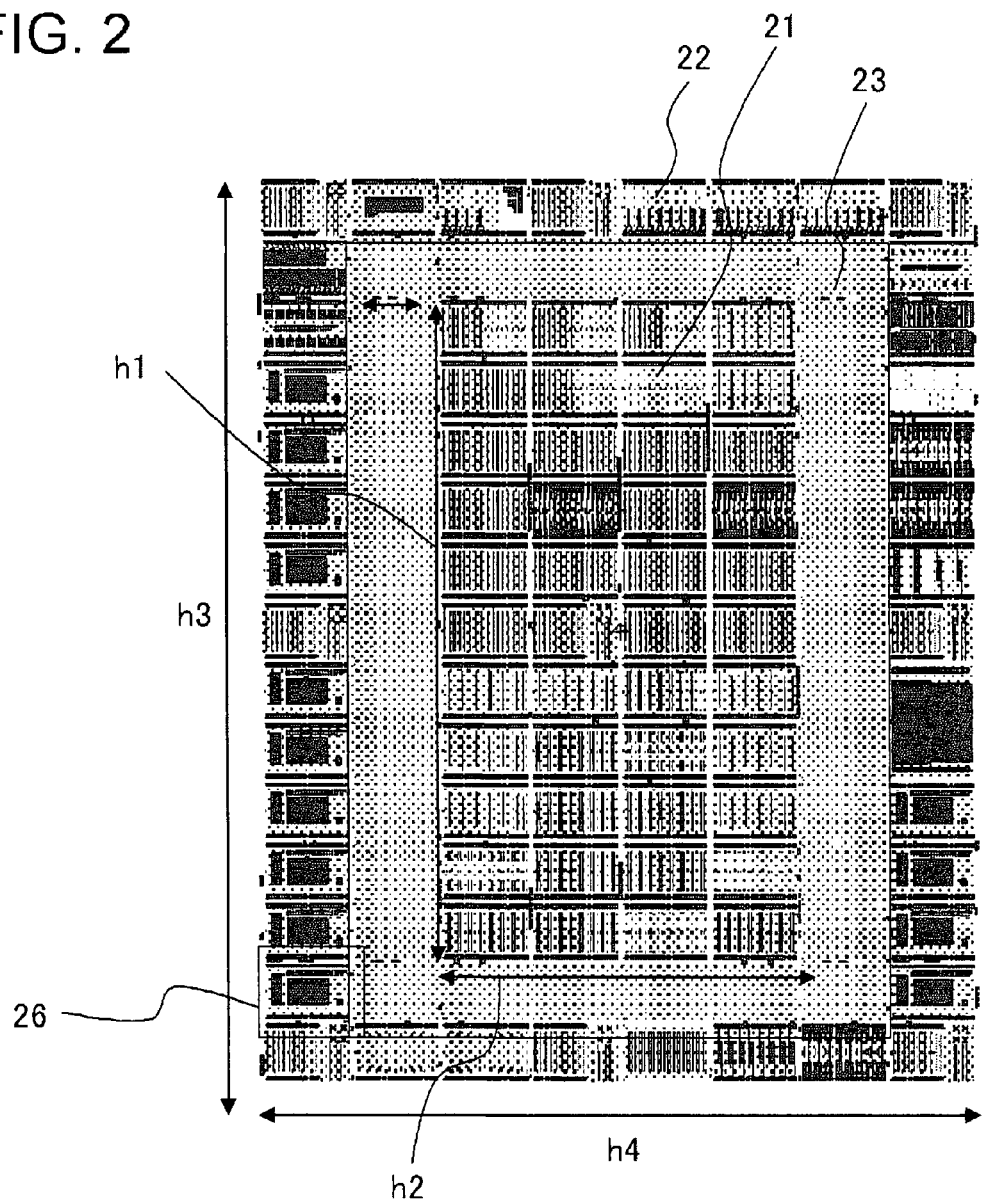
FIG. 2 is a plan view, illustrating an example of an arrangement of TEG for evaluating process.

FIG. 2 is a plan view, showing an example of an arrangement of a test element group (TEG) for process evaluation. Regions for a miniaturizing process are arranged to be longitudinally and transversely symmetric around a center of a field. A pattern for evaluating a process, which mainly aims for evaluating the interconnects having the linewidth of equal to or smaller than 0.1 μm, is disposed in a center region 21. A height and a width of the center region 21, namely a height h1 and a width h2 of a field of a short wave length lithography are 10 mm and 5 mm, respectively.

A circumference region 22 is provided with rough patterns, which is other than a micro interconnect pattern for an evaluation. More specifically, the rough patterns are composed of interconnects having the linewidth of larger than 0.1 μm. In an example of a TEG for evaluating a backend process, interconnects having wider linewidth are disposed in a circumference region 22. This is because larger area of interconnects leads to a generation of a flare, so that a considerable obstacle is caused for forming micro interconnects. In order to prevent such problem, fine patterns are collected in a center region. A pattern of interconnects having larger area is disposed in a circumference portion. Typical patterns that employ the TEG having larger interconnect area include a stress induced void (SIV) pattern that generates a failure for a certain area ratio of vias and interconnects, a pattern for evaluating a linewidth dependency, a pattern for measuring capacitance and the like. Such pattern is disposed only in the circumference region 22. A flare is easily generated in a block having larger interconnect area. Therefore, an influence of a micro interconnect of the center on a patterning can be effectively eliminated by disposing the interconnect region having larger area in the outside thereof. A height and a width of the circumference region 22, namely a height h3 and a width h4 of a field of the long wave length lithography are 25 mm and 20 mm, respectively.

A prohibited region 23 having no TEG disposed therein is present between the center region 21 and the circumference region 22. The prohibited region 23 is composed of sub chips 26. A dimension of the sub chip 26 is 2,380 μm in x-direction (transverse direction in the diagram) and 1,580 μm in y-direction (longitudinal direction in the diagram). The center region 21, the circumference region 22 and the prohibited region 23 correspond to the region 11, the region 12 and the region 13 of FIG. 1, respectively.

Figure 3:
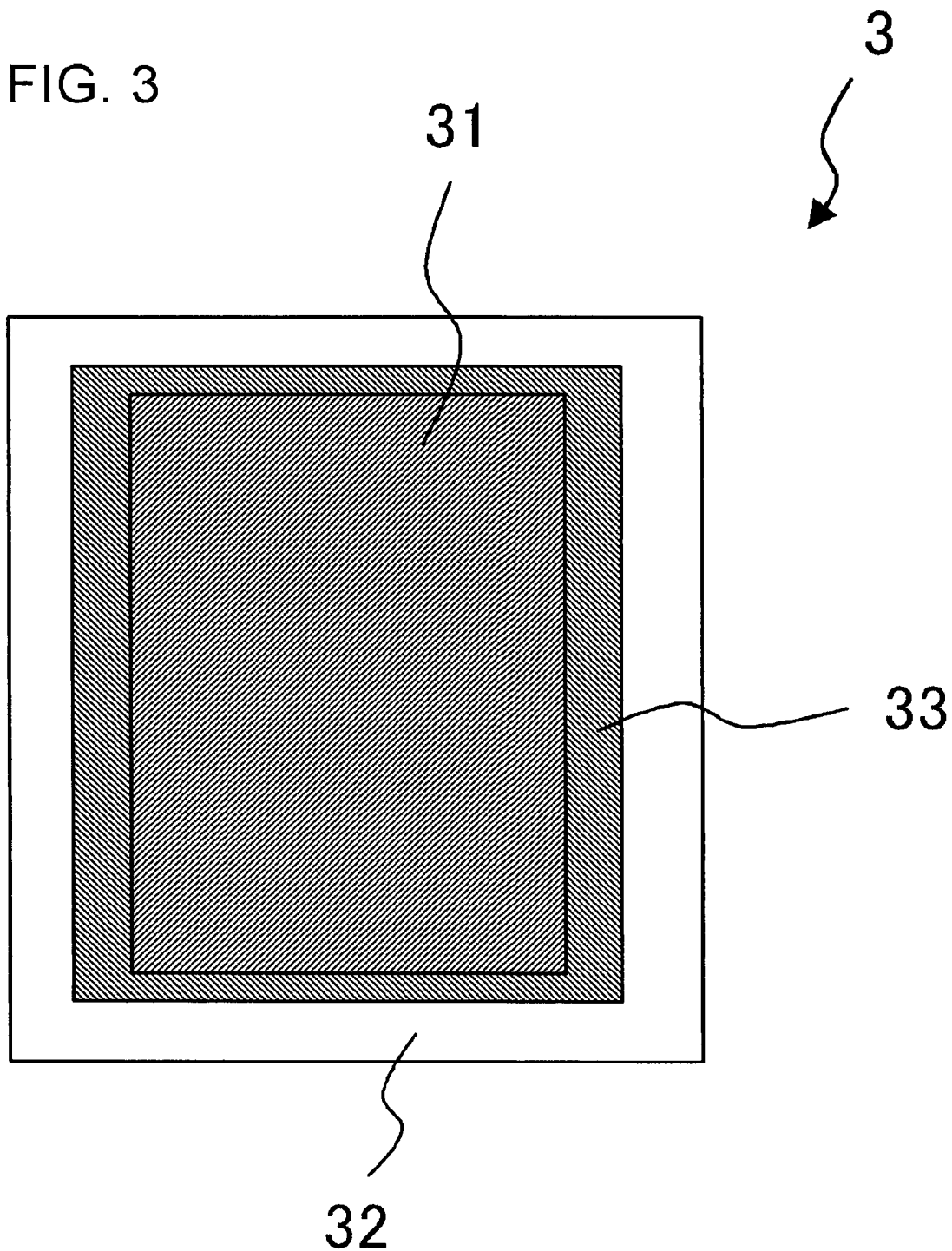
FIG. 3 is a plan view, illustrating a mask according to an embodiment of the present invention.

FIG. 3 is a plan view, showing a mask according to an embodiment of the present invention. A mask 3 is a photo mask that is employed for a manufacture of the semiconductor integrated circuit 1, and includes a first mask pattern formed in a portion 31 (first portion) of the mask 3 and a second mask pattern formed in a portion 32 (second portion) of the mask 3. The first and the second mask patterns are not shown in FIG. 3.

The first mask pattern corresponds to the interconnect pattern of the first interconnect, and is transferred to the region 11 on the substrate by the short wave length lithography. On the other hand, the second mask pattern corresponds to the interconnect pattern of the second interconnect, and is transferred to the region 12 on the substrate by the long wave length lithography. Therefore, in the mask 3, a portion 32 corresponding to the region 12 surrounds or encloses a portion 31 corresponding to the region 11. Further, the portion 31 is spaced apart from the portion 32, and no mask pattern is present in a portion 33 (pattern-prohibited portion) between the portions 31 and 32.

An embodiment of a method for manufacturing a semiconductor integrated circuit according to the present invention is a method for manufacturing the semiconductor integrated circuit 1 employing the mask 3, and includes transferring the first mask pattern onto the region 11 on the substrate by the short wave length lithography, and transferring the second mask pattern onto the region 12 on said substrate by the long wave length lithography.

Advantageous effects obtainable by employing the configuration of the present embodiment will be described. In the semiconductor integrated circuit 1, the minimum design dimension in linewidth of the first interconnect is relatively smaller, and the minimum design dimension in linewidth of the second interconnect is relatively larger. Therefore, in the manufacture of the semiconductor integrated circuit 1, lithography utilizing light of relatively shorter wave length may be employed for forming the interconnect pattern of the first interconnect, and lithography utilizing light of relatively longer wave length may be employed for forming the interconnect pattern of the second interconnect. Actually, the manufacturing process described above employs the lithography utilizing light of relatively shorter wave length and the lithography utilizing light of relatively longer wave length for forming the first and the second interconnect patterns, respectively.

Here, the region 12 provided with the second interconnect is the region surrounding the region 11 provided with the first interconnect. Therefore, the field size in the short wave length lithography is smaller than the field size in the long wave length lithography. This allows obtaining sufficient optical intensity in the short wave length lithography. This contributes to an improvement in the resolution of the short wave length lithography, and eventually a miniaturization of the first interconnect.

Further, according to the configuration of the mask 3, the first mask pattern formed in the first portion is transferred to the region 11 on the substrate by the short wave length lithography, and the second mask pattern formed in the second portion is transferred to the region 12 on the substrate by the long wave length lithography. Here, the second portion is the portion surrounding the first portion. Therefore, a field size in the short wave length lithography is smaller than a field size in the long wave length lithography. This configuration allows obtaining sufficient optical intensity in the short wave length lithography.

The region 13 having no interconnect pattern is provided between the region 11 and the region 12. The region 13 is the region where a formation of a desired pattern is not ensured due to a data blurring in the peripheral of the mask. Therefore, a formation of unwanted pattern can be prevented by not providing any interconnect pattern in this region 13.

When the minimum design dimension in linewidth of the first interconnect is equal to or smaller than 0.1 μm, it is required to employ light of a particularly shorter wave length in the short wave length lithography. Then, the problem described above related to the conventional technology, namely the problem of a difficulty in obtaining sufficient optical intensity, is considerable. Therefore, in such situation, the present invention, which achieves obtaining sufficient optical intensity in the short wave length lithography, is particularly useful.

When both of the lights of the first and the second wave lengths are excimer laser beam, the process can be conducted with a simple apparatus for the short wave length lithography and the long wave length lithography. On the contrary, for example, when at least one of lights of the first and the second wave lengths is x-ray, a large-scale apparatus such as an x-ray lithography apparatus should be employed.

In addition to above, as described above, Japanese Laid-Open patent publication No. H6-89839 discloses performing double exposures over a resist on a semiconductor wafer with x-ray and ultra-violet ray. It is described that such double exposures are performed for supplementing a shortage of exposure caused in the x-ray lithography with UV-exposure. However, such method can not supplement the shortage of exposure in the UV-exposure.

Figure 4:
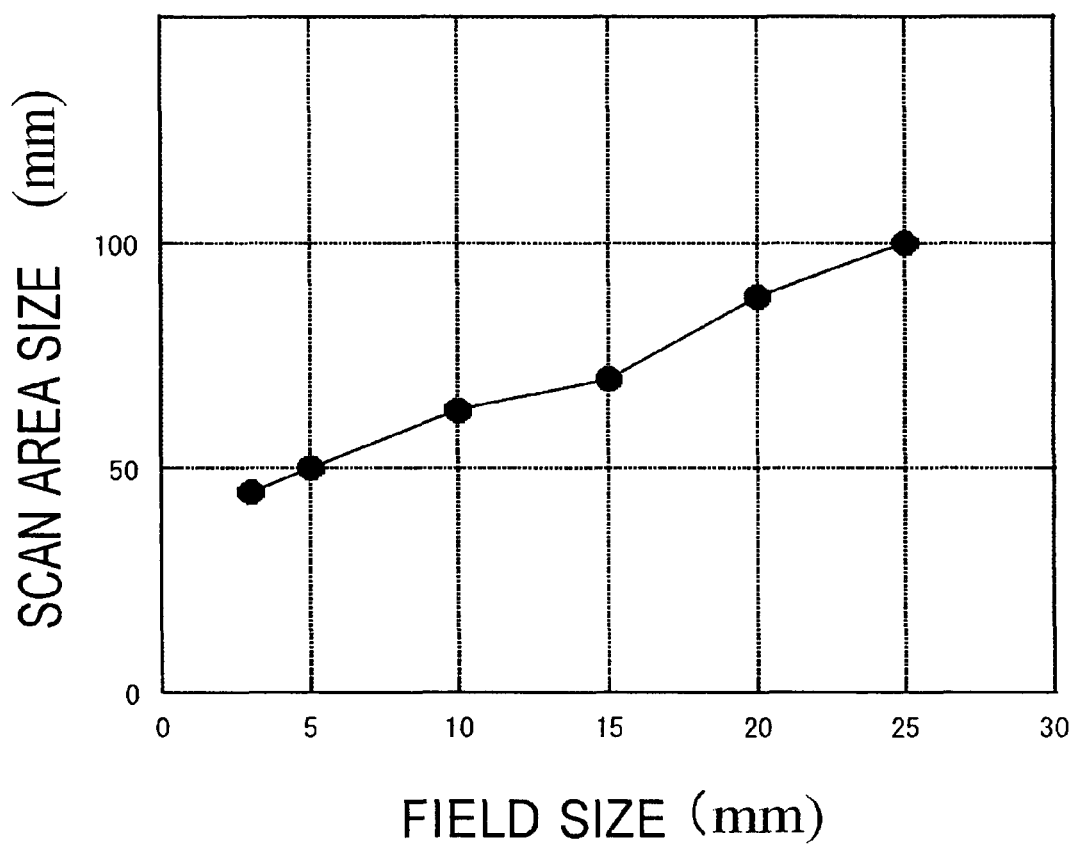
FIG. 4 is a graph, showing a dependency of a scan area size on a field size.
Figure 5:
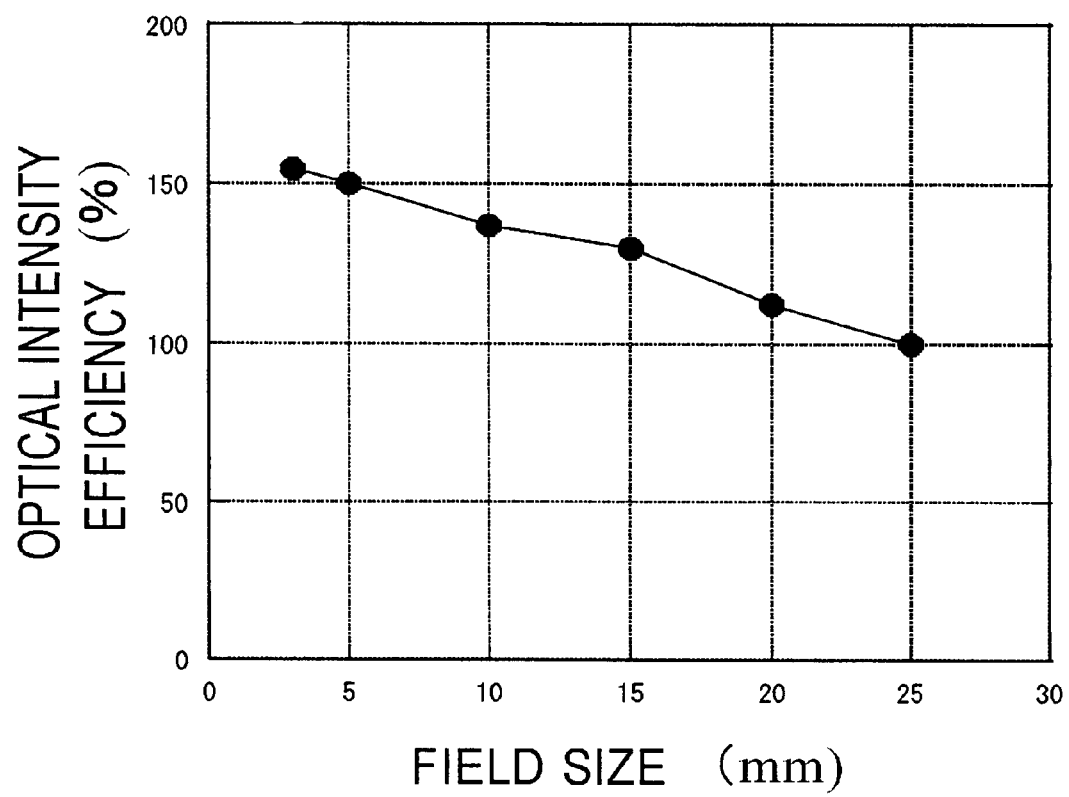
FIG. 5 is a graph, showing a dependency of an optical intensity efficiency on the field size.

FIG. 4 is a graph, showing a dependency of a scan area size on a field size. FIG. 5 is a graph, showing a dependency of an optical intensity efficiency on the field size. Ordinate of FIG. 5 represents an optical intensity efficiency (%), taking the optical intensity efficiency for the field size of 25 mm is assumed to be 100%. In such example, an offset scan area of 15 mm is present in addition to the effective scan area. When the scan area as the device exposure region is simply reduced from 25 mm under such condition, the scan area is linearly decreased. The optical intensity efficiency is linearly increased with a decrease in the scan area size. For example, as can be seen from FIG. 5, the field size of around 10 to 15 mm provides an increased efficiency of the optical intensity by about 30%, as compared with the case of 25 mm.

Concerning such tendency, it is preferable to increase the optical intensity efficiency by 20% or more, in view of obtaining an improved advantageous effect related to devices. Therefore, as can be seen from FIG. 5, a considerable advantageous effect can be expected for achieving a miniaturization by selecting the field size to be equal to or smaller than 20 mm. More specifically, it is preferable that the first region has a dimension, which is small enough to fit within a region of a square of 20 mm on a side. For example, when the first region is a square of 20 mm of less on a side, a rectangle of 20 mm of less on a longer side, or a circle of 20 mm or less in diameter, the first region fits within a region of a square of 20 mm on a side. On the other hand, when the first region is a square of longer than 20 mm on a side, a rectangle of longer than 20 mm on a longer side, or a circle of longer than 20 mm in diameter, the first region does not fit within a region of a square of 20 mm on a side.

Figure 6:
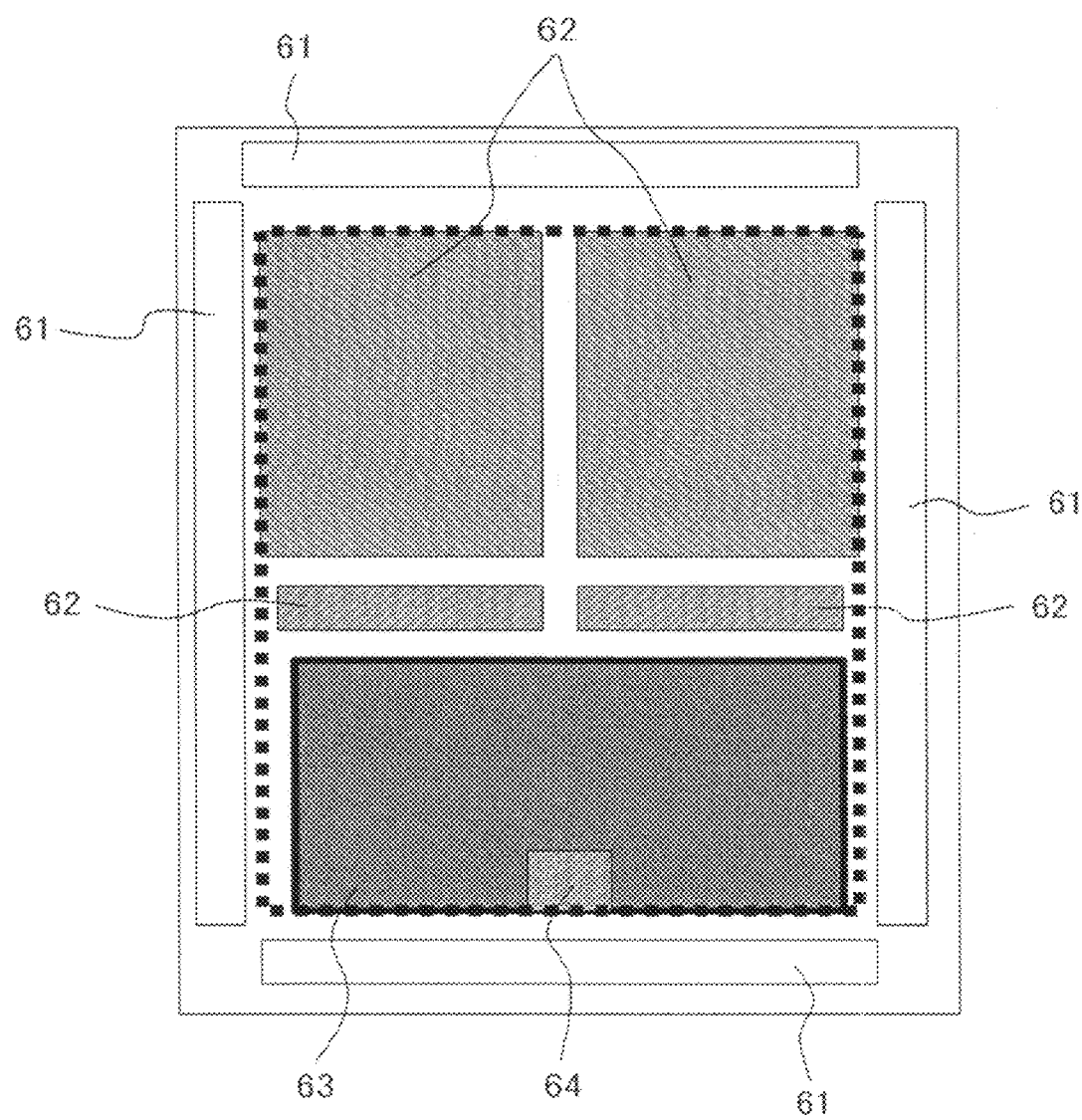
FIG. 6 is a plan view, illustrating a CPU logic circuit, to which the present invention can be applied.
Figure 7:
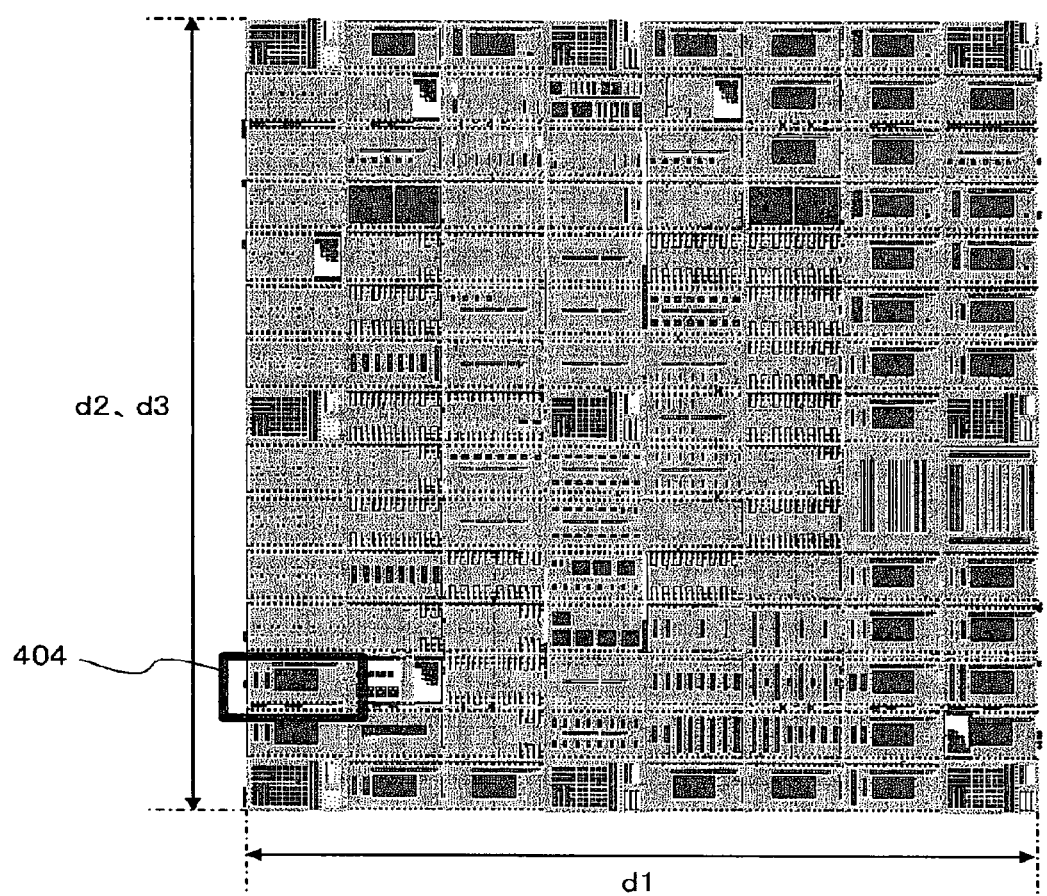
FIG. 7 is a plan view, illustrating a layout of a general test chip for evaluating process.
Figure 8A:
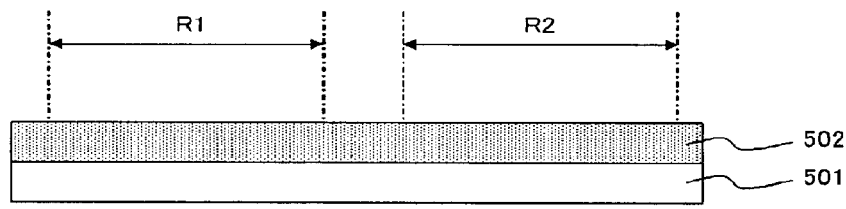
FIGS. 8A and 8B are cross-sectional views, useful in describing the process for forming a general dual-layered interconnect.
Figure 8B:
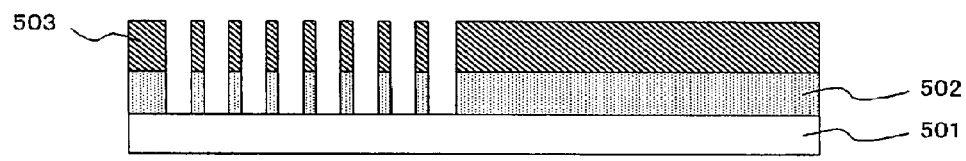
Figure 9A:
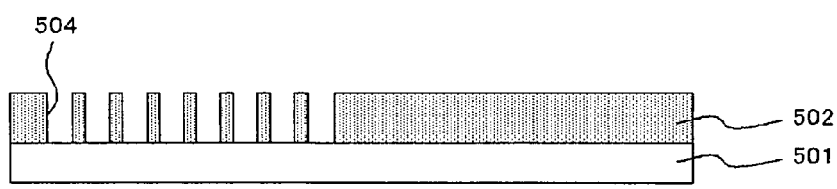
FIGS. 9A and 9B are cross-sectional views, useful in describing the process for forming a general dual-layered interconnect.
Figure 9B:
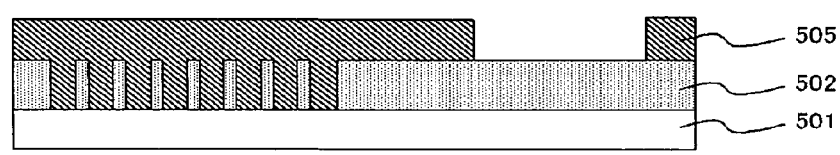
Figure 10A:
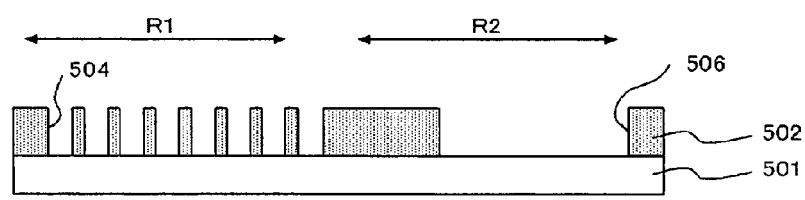
FIGS. 10A to 10C are cross-sectional views, useful in describing the process for forming a general dual-layered interconnect.
Figure 10B:
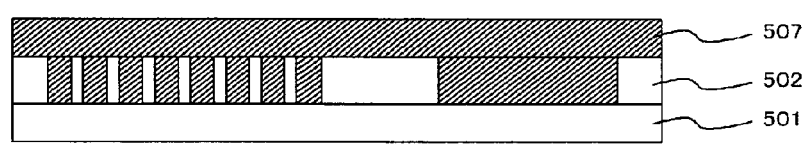
Figure 10C:
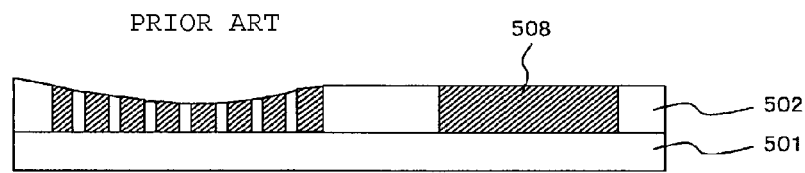
Figure 11A:
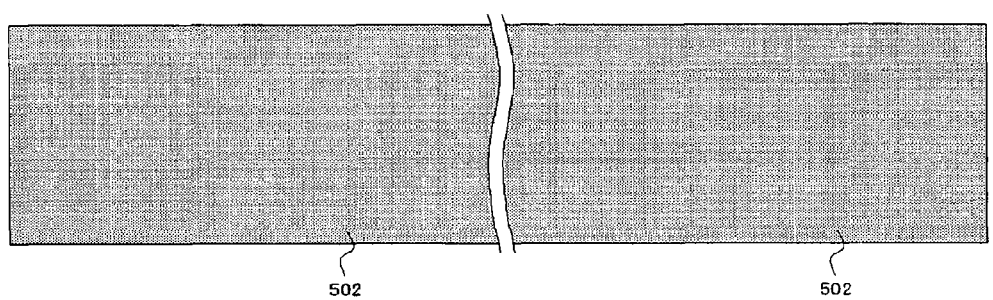
FIGS. 11A and 11B are plan views, useful in describing the process for forming a general dual-layered interconnect.
Figure 11B:
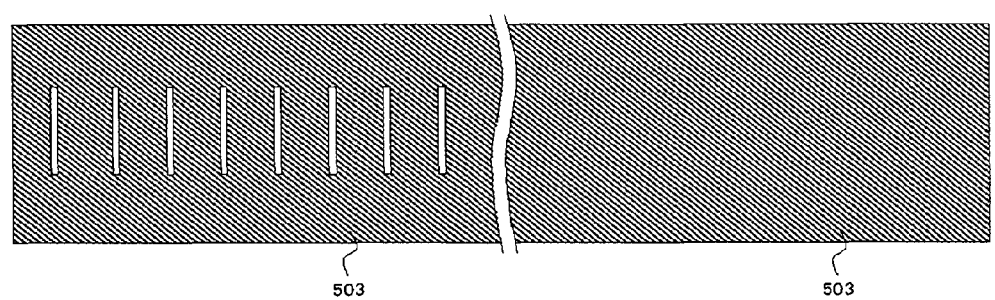
Figure 12A:
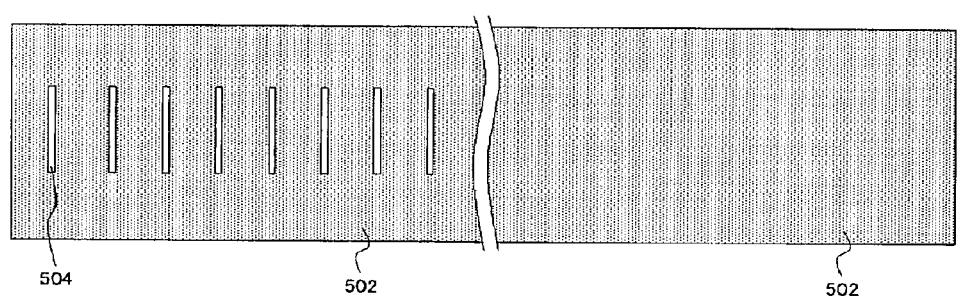
FIGS. 12A and 12B are plan views, useful in describing the process for forming a general dual-layered interconnect.
Figure 12B:
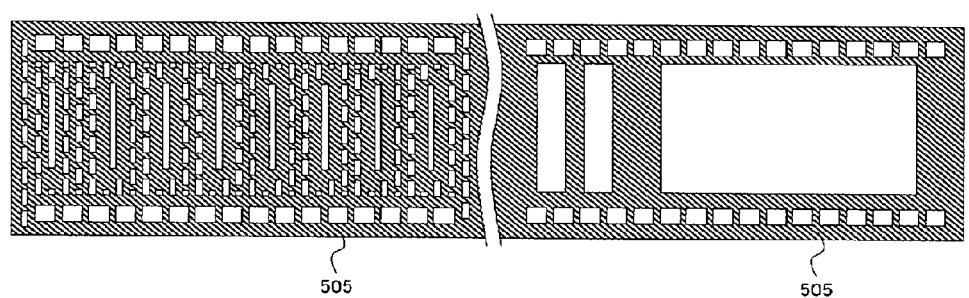
Figure 13A:
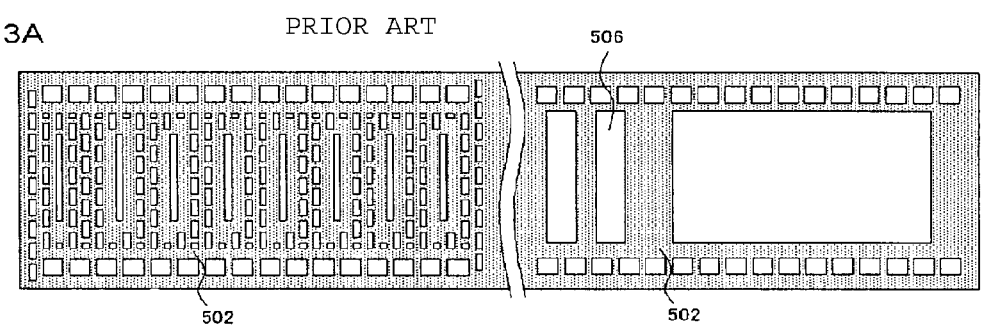
FIGS. 13A to 13C are plan views, useful in describing the process for forming a general dual-layered interconnect.
Figure 13B:
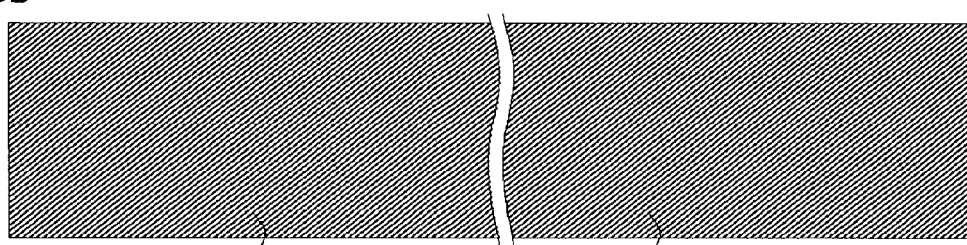
Figure 13C:
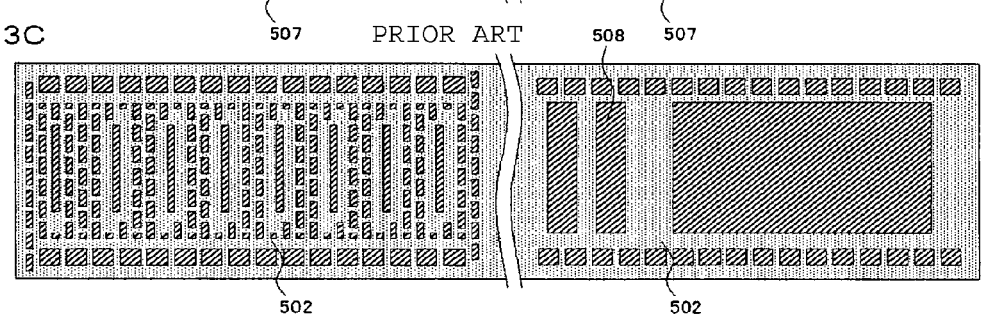
Figure 14:
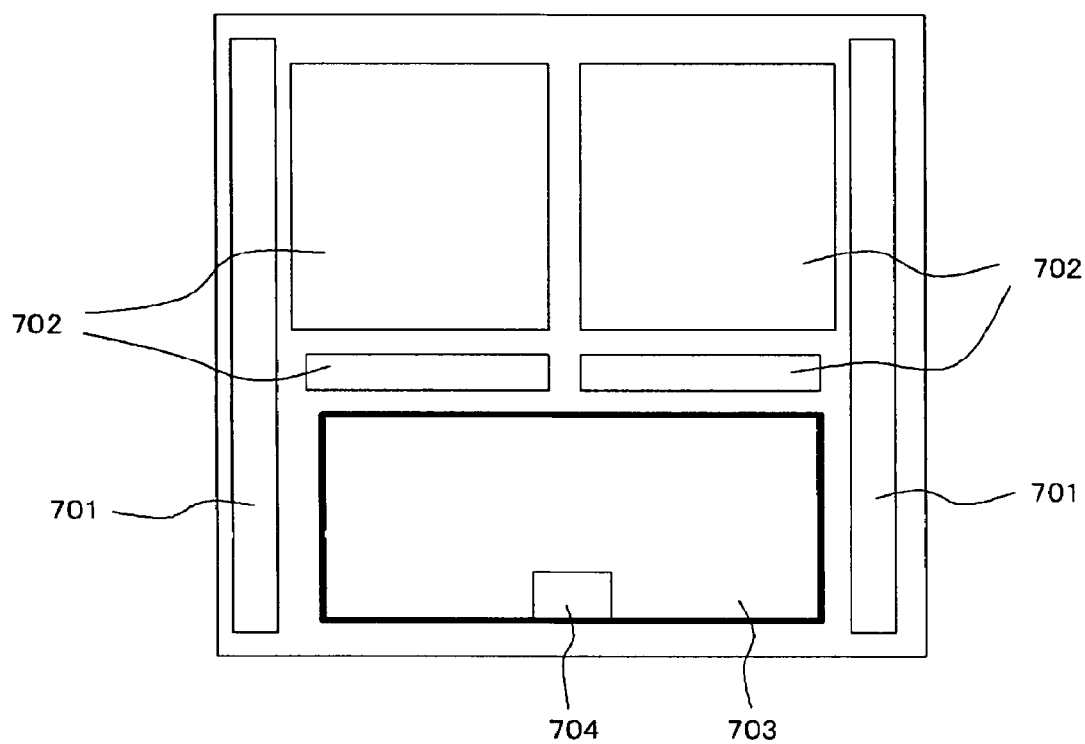
FIG. 14 is a plan view, illustrating an outline of a general logic product.

The present invention may also be applied to, for example, a CPU logic circuit as shown in FIG. 6. A CPU logic circuit in FIG. 6 includes I/O blocks (interface blocks) 61, RAM blocks 62, a high performance logic block 63 and a PLL block 64. The I/O block 61 is referred to as a peripheral I/O, and corresponds to the region 12 (see FIG. 1). Further, the RAM block 62, the high performance logic block 63 and the PLL block 64 are miniaturized regions including interconnects having the linewidth of equal to or smaller than 0.1 μm, and corresponds to the region 11.

Interconnects in the I/O block 61 is limited to interconnects having the linewidth of longer than 0.1 μm. Further, the I/O block 61 is patterned by the long wave length lithography. As described above, the minimum design dimension of the interconnect in the I/O block 61 is suitably limited, so that the field area of the short wave length lithography can be reduced by the area of the I/O block 61.

The micro interconnect data in the I/O block 61 can be eliminated to reduce the data area, thereby providing an improved optical intensity. This provides a reduced field size for the short wave length lithography, advantageously achieving an improved resolution. Further, an arrangement linked with the aperture structure of the lithography is created, so that an exposure process with a limited field can be applied, thereby obtaining a semiconductor integrated circuit having a fine pattern.

It is not intended to limit the scopes of the semiconductor integrated circuit and the method for manufacturing thereof, and the mask, according to the present invention to the above-described exemplary implementations, and various modifications may be applied. For example, while the exemplary implementation of employing two regions composed of the first region and the second region for the regions where an interconnect pattern is formed, is illustrated in the above-described embodiment, three or more regions may alternatively be provided for the regions where an interconnect pattern is formed. For example, a third region surrounding the second region may additionally be provided. When three or more regions are provided as described above, the first interconnect, which is formed in the first region located innermost, employs the smallest minimum design dimension in linewidth as compared with interconnects in any other regions.

While the interconnect is exemplified as a conductor in the above-described embodiment, the conductor may be a gate electrode, silicide layer, or diffusion layer. That is, the present invention is applicable not only to the interconnect, but also to the gate electrode, silicide layer, or diffusion layer.

It is apparent that the present invention is not limited to the above embodiment, and may be modified and changed without departing from the scope and spirit of the invention.

What is claimed is:

1. A semiconductor integrated circuit, comprising:
    a first region including a logic block and a PLL block; and
    a second region including an I/O block that surrounds said first region,
    wherein said second region includes interconnects being limited to a minimum design dimension in linewidth of longer than 0.1 µm, and
    wherein said first region includes interconnects having a minimum design dimension in linewidth of equal to or smaller than 0.1 µm.

2. The semiconductor integrated circuit according to claim 1,
    wherein said first region is spaced apart from said second region, and no conductor pattern is included in a region between said first region and said second region.

3. The semiconductor integrated circuit according to claim 1,
    wherein said first region has a dimension, which is small enough to fit within a region of a square of 20 mm on a side.

4. The semiconductor integrated circuit according to claim 1,
    wherein each of said first and said second conductors is an interconnect, gate electrode, silicide layer, or diffusion layer.

* * * * *